United States Patent [19]

Endo et al.

[11] 4,376,336

[45] Mar. 15, 1983

[54] METHOD FOR FABRICATING A SEMICONDUCTOR DEVICE

[75] Inventors: Norio Endo; Hisakazu Iizuka, both of Yokohama, Japan

[73] Assignee: Tokyo Shibaura Denki Kabushiki Kaisha, Japan

[21] Appl. No.: 290,429

[22] Filed: Aug. 6, 1981

[30] Foreign Application Priority Data

Aug. 12, 1980 [JP] Japan ................................. 55-110906

[51] Int. Cl.³ .......................................... H01L 21/26
[52] U.S. Cl. .................................. 29/571; 29/576 B; 29/578; 148/187
[58] Field of Search ..................... 29/571, 576 B, 578; 148/187

[56] References Cited

U.S. PATENT DOCUMENTS

| | | | |
|---|---|---|---|
| 3,873,373 | 3/1975 | Hill | 148/187 |
| 3,913,211 | 10/1975 | Seeds et al. | 29/571 |
| 4,179,311 | 12/1979 | Athanas | 148/187 X |
| 4,246,044 | 1/1981 | Yanase | 148/187 X |
| 4,272,308 | 6/1981 | Varshney | 148/187 |
| 4,287,661 | 9/1981 | Stoffel | 29/571 |

Primary Examiner—G. Ozaki
Attorney, Agent, or Firm—Finnegan, Henderson, Farabow, Garrett & Dunner

[57] ABSTRACT

The invention provides a method for fabricating a semiconductor device comprising the steps of: forming an insulating layer on a semiconductor substrate; selectively forming an oxidation preventive film on the surface of said insulating layer; depositing polycrystalline silicon on the entire surface of said substrate including said oxidation preventive film; selectively etching said polycrystalline silicon so as to leave said polycrystalline silicon only around the sides of said oxidation preventive film by an etching method having a directivity perpendicular to the surface of said substrate; ion-implanting an impurity for preventing inversion in said substrate using as a mask said oxidation preventive film and said polycrystalline silicon remaining therearound; and forming a field insulator film including an oxide of said polycrystalline silicon by oxidizing the surface of said substrate. A higher integration and a higher reliability of elements may be attained according to the method of the invention.

9 Claims, 14 Drawing Figures

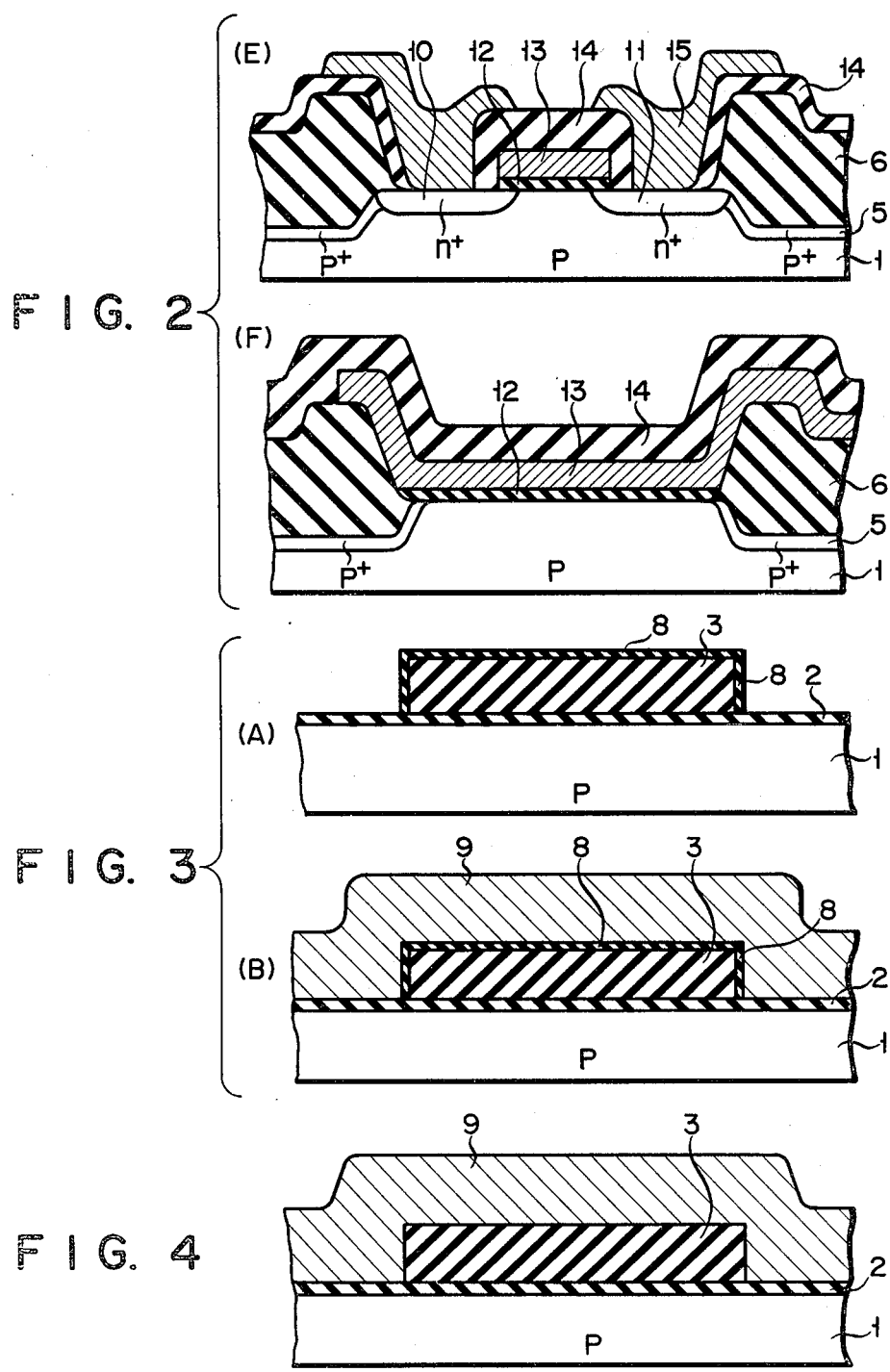

METHOD FOR FABRICATING A SEMICONDUCTOR DEVICE

BACKGROUND OF THE INVENTION

The present invention relates to a method for fabricating a semiconductor device and, more particularly, to a method for forming a field insulator film surrounding an element region.

The element separating technique utilizing the selective oxidation of a silicon nitride film is widely adopted as a method for fabricating a MOSFET and an integrated circuit incorporating such MOSFETs.

The case for fabricating an integrated circuit incorporating n-channel MOSFET transistors by this method will be described with reference to FIG. 1.

As shown in FIG. 1A, after forming a silicon oxide film 2 on the surface of a p-type silicon substrate 1 by thermal oxidation, a silicon nitride film 3 is deposited thereover as an oxidation preventive film. After forming a resist film 4, the parts of the silicon nitride film 3 excluding the element regions to form a source region, a drain region and a gate electrode are selectively etched away by photolithography. While keeping the deposited resist film 4, boron is ion-implanted to form a field inversion preventive layer 5.

After removing the resist film 4, field oxidation is performed to form a field insulator film 6 to achieve the structure as shown in FIG. 1B. An oxide film 7 on the silicon nitride film 3 formed by this oxidation process, the silicon nitride film 3, and the underlying silicon oxide film 2 are sequentially etched away. The elements are formed according to the known method to complete fabrication of an n-channel MOS-type field effect transistor as shown in FIG. 1C. Referring to FIG. 1C, reference numerals 10 and 11 denote a source region and a drain region, respectively; 13, a gate electrode of polycrystalline silicon formed on a gate silicon oxide film 12 on a channel region between the source region 10 and the drain region 11; 14, an interlaid insulator film; and 15, an aluminum wiring layer.

The plan view of this transistor element is shown by the model view of FIG. 1D. A section of this plan view along the line a—a is shown in FIG. 1C, and a section along the line b—b is shown in FIG. 1E.

The conventional element separation by selective oxidation as described above has the drawbacks to be described below.

First, as shown in FIG. 1B, the edges of the silicon nitride film 3 are turned up, and the element region is reduced by $\alpha$ at each side in the longitudinal direction of the channel, and is also reduced by $\alpha$ at each side in the direction of the channel width as shown in FIG. 1E. For this reason, for obtaining one element region of a desired size as the final shape, the width and length of the resist film 4 must first be greater by $2\alpha$ in both directions than the actual size required.

When a blank region is to be 3 $\mu$m between element regions, between wirings utilizing impurity regions formed by diffusion of an impurity into a substrate, or between these two types of regions, the blank region between the edges of the resist film 4 of FIG. 1A becomes 1.5 $\mu$m if conversion difference $\alpha$ by the selective oxidation is 0.75 $\mu$m at each side. This results in technical difficulties. Although the conversion difference $\alpha$ may be reduced by thickening the silicon nitride film 3, this results in extra stress exerted on the edges of the element region and adversely affects the elements.

Secondly, boron in the field inversion preventive layer 5 formed by implantation of boron ions using the silicon nitride film 3 as a mask diffuses into the element region during field oxidation, and the channel width is thereby reduced by $\alpha$ at each side as shown in FIG. 1E. With an element having a small finished channel width of 3 $\mu$m, for example, the reduction by $\alpha$ is significant. For this reason, the silicon nitride film 3 must be formed in a greater size considering this reduction.

Thirdly, the turning up of the edges of the silicon nitride film 3 under thermal oxidation exerts stress on the element region. This causes crystal defects and reduces the reliability of the transistor.

SUMMARY OF THE INVENTION

The present invention has been made in consideration of this and has for its object to provide a method for fabricating a semiconductor device according to which a higher packaging density of elements may be achieved without considering an extra conversion difference, control of the channel width may be easy, no stress may be exerted on the edges of the element region, and elements of excellent reliability may be obtained.

According to the present invention, there is provided a method for fabricating a semiconductor device comprising the steps of:

forming an insulating layer on a semiconductor substrate;

selectively forming an oxidation preventive film on the surface of said insulating layer;

depositing polycrystalline silicon on the entire surface of said substrate including said oxidation preventive film;

selectively etching said polycrystalline silicon so as to leave said polycrystalline silicon only around the sides of said oxidation preventive film by an etching method having a directivity perpendicular to the surface of said substrate;

ion-implanting an impurity for preventing inversion in said substrate using as a mask said oxidation preventive film and said polycrystalline silicon remaining therearound; and forming a field insulator film including an oxide of said polycrystalline silicon by oxidizing the surface of said substrate.

According to the method of the present invention, the step of selectively forming an oxidation preventive film having a silicon oxide film thereon on an insulating layer is preferably adopted in place of the step for forming the oxidation preventive film. The oxidation preventive film preferably consists of silicon nitride.

BRIEF DESCRIPTION OF THE DRAWINGS

FIGS. 3A and 3B are sectional views showing other embodiments of the method of the present invention; and FIG. 4 is a sectional view showing still another embodiment of the method of the present invention.

DESCRIPTION OF THE PREFERRED EMBODIMENTS

Figure 1:
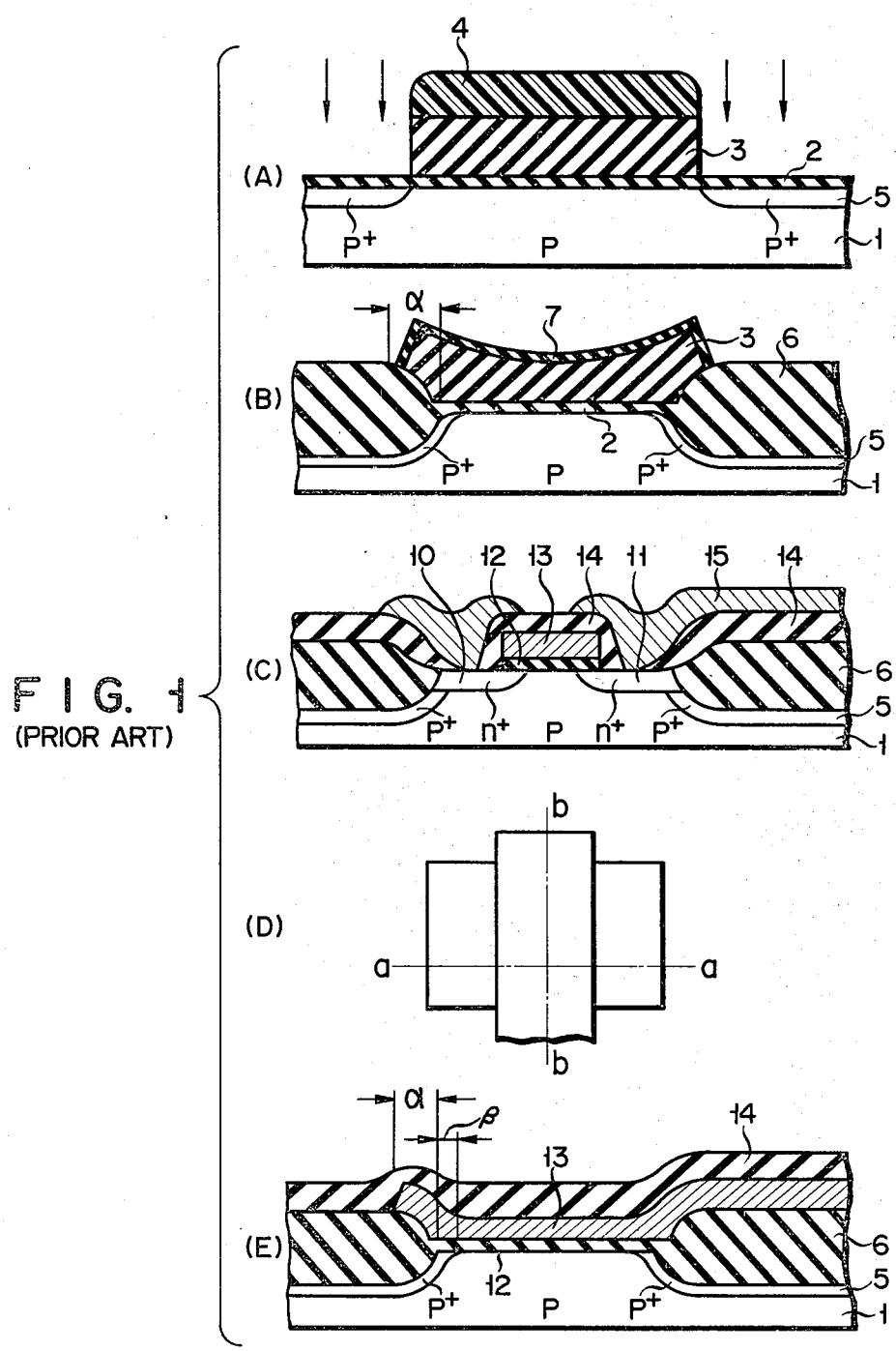
FIGS. 1A through 1C are sectional views showing in sequential order the steps of the conventional method.
FIG. 1D is a plan view of the element region.
FIG. 1E is a sectional view along the line b—b of FIG. 1D.
Figure 2:
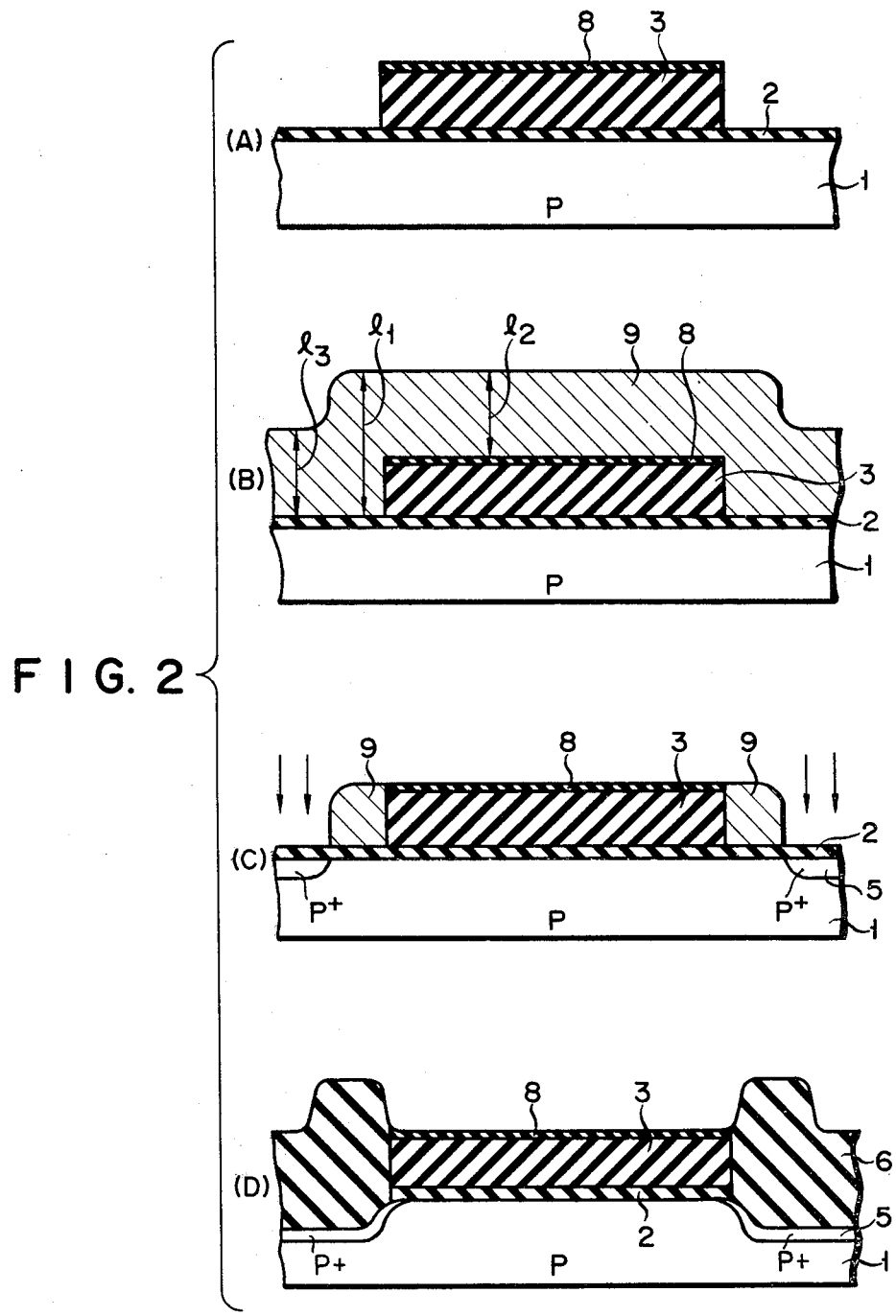
FIGS. 2A through 2E are sectional views showing in sequential order the steps of an embodiment of the method of the present invention.
FIG. 2F is a sectional view along a line perpendicular to the section of FIG. 2E.

The method of the present invention will now be described in more detail with reference to the accompanying drawings.

FIGS. 2A through 2F are sectional views showing in sequential order the steps of one embodiment of the method of the present invention.

As the semiconductor substrate is used a p-type silicon substrate 1. The silicon oxide film 2 is formed by thermal oxidation to a thickness of about 1,000 Å on the surface of the silicon substrate 1, and thereafter, the silicon nitride film 3 is deposited thereover to a thickness of about 3,000 Å. After forming a silicon oxide film 8 having a thickness of about 100 Å on the silicon nitride film 3, the parts of the silicon nitride film 3 excluding the element regions to form the source region, the drain region and the gate electrode, and the silicon oxide film 8 formed thereover are selectively etched away to leave the structure as shown in FIG. 2A.

A polycrystalline silicon layer 9 having a thickness of about 5,000 Å is formed over the entire surface of the structure by the CVD process. A thickness $l_1$ of the part of the polycrystalline silicon layer 9 immediately beside the silicon nitride film 3 is substantially greater than a thickness $l_2$ of the polycrystalline silicon layer 9 above the silicon nitride film 3 and is also greater than a thickness $l_3$ of the part of the polycrystalline silicon layer 9 on the silicon oxide film 2 farther from the silicon nitride film 3. The entire surface of the structure is subjected to reactive-ion etching. Since the etching progresses in the direction perpendicular to the surface of the substrate in reactive-ion etching, the polycrystalline silicon layer 9 remains around the sides of the silicon nitride film 3 as shown in FIG. 2C at the time when the polycrystalline silicon layer 9 on the silicon oxide film 8 is completely removed. The silicon oxide film 8 formed on the silicon nitride film 3 acts as a stopper in the etching step of the polycrystalline silicon layer and prevents reduction of the silicon nitride film 3.

Under this condition, boron is ion-implanted to a concentration of $6 \times 10^{13}/cm^2$ at an accelerating voltage of 40 KeV using the silicon nitride film 3 and the polycrystalline silicon layer 9 therearound as a mask to form the field inversion preventive layer 5 in the silicon substrate 1.

The field insulator film 6 having a thickness of about 1 μm is formed on the field part by a usual oxidation method, for example, burning oxidation with hydrogen and oxygen, to provide the structure as shown in FIG. 2D. The silicon nitride film 3 acts as an oxidation preventive film against the field oxidation. In addition, since the polycrystalline silicon layer 9 remaining around the sides of the silicon nitride film 3 reacts with $H_2O$ molecules supplied near it and is oxidized during the field oxidation, the oxidation of the part of the silicon substrate 1 below the polycrystalline silicon layer 9 progresses at a speed slower than the oxidizing speed in the case where the polycrystalline silicon layer 9 is not present. In this manner, the silicon nitride film 3 may be prevented from turning up at the edges.

According to the usual method, the silicon oxide film 2 surrounded by the field insulator film 6, the silicon nitride film 3, and the silicon oxide film 8 are etched away to expose the surface of the silicon substrate 1 (not shown). Thermal oxidation is then performed to form a thermally oxidized film on the exposed surface of the silicon substrate 1. After depositing a polycrystalline silicon layer on the thermally oxidized film, this polycrystalline silicon layer is selectively removed by the photoengraving process to form the polycrystalline silicon gate 13. The thermally oxidized film is then selectively etched to form holes through which an impurity is to be diffused into the silicon substrate. An n-type impurity is introduced through these holes to form the source region 10 and the drain region 11. After selectively forming the interlaid insulator film 14, the aluminum wiring layer 15 is finally formed to complete an MOS type field effect transistor as shown in FIG. 2E. Reference numeral 12 denotes the silicon oxide gate film formed on the channel region. FIG. 2F shows the section of the structure shown in FIG. 2E along a line perpendicular to the section in FIG. 2E, and corresponds to FIG. 1E of the prior art method.

According to the method as described above, in the step of field oxidation, the edges of the silicon nitride film 3 do not turn up so that the value of $\alpha$ shown in FIGS. 1B and 1E may be reduced substantially to zero. Thus, an extra conversion difference need not be considered, and a higher packaging density of elements may be attained.

Since the turning up of the edges of the silicon nitride film 3 does not occur, extra stress is not exerted on the silicon substrate 1 after the field oxidation so that excellent element reliability may be obtained.

Since the implantation of boron ions is performed using the silicon nitride film 3 and the polycrystalline silicon layer 9 left therearound as a mask, boron is ion-implanted at a place farther from the edges of the silicon nitride film 3. Accordingly, the impurity such as boron may not diffuse into the parts of the silicon substrate 1 below the silicon nitride film 3 in the field oxidation step. The narrow channel effects wherein the channel width is narrowed in the direction perpendicular to the direction of the source and drain regions of the transistor may be prevented, and control of the channel width may be made easier.

FIG. 3 shows another embodiment of the method of the present invention.

According to this embodiment of the method of the present invention, after forming the silicon oxide film 2 on the surface of the p-type silicon substrate 1 and forming the silicon nitride film 3 thereover, the parts of the silicon nitride film 3 excluding the element regions and the wiring regions are selectively etched to form a silicon nitride film 3 as shown in FIG. 3A. After forming the silicon oxide film 8 having a thickness of about 100 Å as the stopper on the upper surface and the side surfaces of the silicon nitride film 3, the polycrystalline silicon layer 9 is deposited to a thickness of about 5,000 Å on the entire surface of the structure as shown in FIG. 3B. Thereafter, a MOSFET may be formed by sequentially performing the respective steps of etching, field oxidation, and element formation in a manner similar to the embodiment described with reference to FIGS. 2C to 2F.

In the embodiment described above, for etching the deposited polycrystalline silicon layer 9, the silicon oxide film 8 was formed as the stopper on the surface of the silicon nitride film 3. However, as shown in FIG. 4, the polycrystalline silicon layer 9 may be directly deposited without forming the silicon oxide film 8, and may then be etched.

The controllability of the reactive-ion etching for leaving unetched parts of the polycrystalline silicon layer 9 presents a problem. However, the etching progresses only in the vertical direction. Therefore, even if overetching is performed to the extent necessary to remove the polycrystalline silicon layer 9 on the silicon nitride film 3, the lateral etching of the remaining polycrystalline silicon layer 9 does not substantially progress, although the thickness thereof may be slightly reduced. Thus, this problem does not influence the advantages obtainable with the present invention.

In the embodiment described above, the silicon nitride film 3 was used as the oxidation preventive film, and the reactive-ion etching was used as the directive etching. However, other constructions and techniques may be adopted if similar effects may be obtainable therewith. In the description with reference to FIGS. 2 to 4, the same parts are designated by the same reference numerals as in FIG. 1.

In summary, according to the method for fabricating a semiconductor device according to the present invention, a higher packaging density of elements may be attained without considering an extra conversion difference, control of the channel width may be easy, stress may not be exerted on the edges of the element region, and elements of high reliability may be obtained.

What we claim is:

1. A method for fabricating a semiconductor device comprising the steps of:
   forming an insulating layer on a semiconductor substrate;
   selectively forming an oxidation preventive film on said insulating layer;
   depositing polycrystalline silicon on the entire surface of said substrate including said oxidation preventive film;
   selectively etching said polycrystalline silicon so as to leave said polycrystalline silicon only around the sides of said oxidation preventive film by an etching method having a directivity perpendicular to the surface of said substrate;
   ion-implanting an impurity for preventing inversion in said substrate using as a mask said oxidation preventive film and said polycrystalline silicon remaining therearound; and
   forming a field insulator film including an oxide of said polycrystalline silicon by oxidizing the surface of said substrate.

2. A method according to claim 1, wherein the step of selectively forming on said insulating layer an oxidation preventive film having a silicon oxide film on the upper surface thereof is performed in place of the step of forming said oxidation preventive film.

3. A method according to claim 1, wherein the step of selectively forming an oxidation preventive film having a silicon oxide film on the upper surface and the side surfaces thereof is performed in place of the step of forming said oxidation preventive film.

4. A method according to claims 1, 2 or 3, wherein said oxidation preventive film consists of silicon nitride.

5. A method according to claims 1, 2 or 3, wherein said etching involves the reactive-ion etching process.

6. A method according to claims 1, 2 or 3, wherein said semiconductor substrate comprises a silicon substrate of one conductivity type.

7. A method according to claims 1, 2 or 3, wherein said field insulator film comprises a silicon oxide film.

8. A method according to claim 6, further comprising, after the step of forming said field insulator film, the steps of removing a laminate consisting of said insulating layer and said oxidation preventive film and forming regions of opposite conductivity type in parts of said silicon substrate below said laminate.

9. A method according to claim 8, wherein said regions of opposite conductivity type comprise a source region and a drain region of an MOS-type field effect transistor.

* * * * *